United States Patent [19]
Wu

[11] 4,375,600
[45] Mar. 1, 1983

[54] SENSE AMPLIFIER FOR INTEGRATED MEMORY ARRAY

[75] Inventor: Philip T. Wu, Rochester, Minn.

[73] Assignee: International Business Machines Corporation, Armonk, N.Y.

[21] Appl. No.: 260,557

[22] Filed: May 5, 1981

Related U.S. Application Data

[63] Continuation-in-part of Ser. No. 84,030, Oct. 11, 1979, abandoned.

[51] Int. Cl.³ ............... G11C 7/06; G01R 19/165; H03K 5/24; H03K 5/08
[52] U.S. Cl. .................. 307/530; 307/238.2; 307/238.8; 307/581; 307/574; 365/205; 365/206
[58] Field of Search ............... 365/205, 206; 307/530, 307/574, 205, 247, 544, 581, 238.1–238.8

[56] References Cited

U.S. PATENT DOCUMENTS

| | | | |
|---|---|---|---|
| 3,588,848 | 6/1971 | Van Beek | 365/206 |
| 3,846,643 | 11/1974 | Chu et al. | 307/247 R |
| 4,004,170 | 1/1977 | Henke | 307/247 R |
| 4,053,873 | 10/1977 | Freeman et al. | 307/DIG. 3 |
| 4,081,699 | 3/1978 | Hirt et al. | 307/574 |
| 4,082,966 | 4/1978 | Lou | 307/DIG. 3 |
| 4,270,189 | 5/1981 | Brossard et al. | 365/205 |

OTHER PUBLICATIONS

IBM Technical Disclosure Bulletin, vol. 17, No. 4 Sep. 1974, "Read-Only Storage Bit Precharge/Sense Circuit", Cordaro.
IBM Technical Disclosure Bulletin, vol. 23, No. 7A, Dec. 1980 "Sense Amplifier with Resistive Decoupling of Bit Lines", Schuster.
IBM Technical Disclosure Bulletin, vol. 22, No. 11, Apr. 1980 "Sense Latch with Adjusting Series Impedance", Anderson.
IBM Technical Disclosure Bulletin, vol. 24, No. 10, Mar. 1982 "Differential Sense Amplifier for Unbalanced Data Lines" Tien.

Primary Examiner—Saxfield Chatmon, Jr.
Attorney, Agent, or Firm—J. Michael Anglin

[57] ABSTRACT

A memory-array sense amplifier includes a grounded-gate depletion-mode FET connected between a bit line and a sense node. Another FET connects a supply voltage VDD to the sense node when turned on by a clock phase signal. Further FETs form a latch circuit.

7 Claims, 3 Drawing Figures

SENSE AMPLIFIER FOR INTEGRATED MEMORY ARRAY

This application is a continuation-in-part of application Ser. No. 084,030, filed Oct. 11, 1979, now abandoned.

The present invention relates to semiconductor integrated-circuit memory arrays, and particularly concerns a sense-amplifier circuit for increasing the voltage swing of the data-bit signals of such arrays.

To achieve a large density of bit storage, integrated-circuit field-effect-transistor read-write memory chips commonly employ a dynamic, one-device-per-cell structure which stores each bit as a charge on a capacitor. The bit signals, however, must be read out to bit lines on the chip, and the distributed or stray capacitance Cb of each bit line is much larger than the capacitance Cs of the storage cell. Therefore, the maximum voltage swing from a storage cell is Cs/(Cs+Cb) times the supply voltage VDD. At the current state of technology, signals down to 2% of VDD must be resolved; but such signals are often exceeded by circuit noise voltages. Increasing densities will exacerbate this problem, because Cs tends to decrease as the square of the density, while Cb falls only approximately linearly.

Clearly, then, additional amplification is required as storage density increases. Some previous memory sense amplifiers have included an enhancement-mode FET (EFET) with its gate tied to a supply line and coupled to a clocked FET of the same type. This arrangement, however, tends to be noisy. The supply line itself is noisy, and the continually fluctuating loads in the memory array couple noise spikes into the voltage supply line and thence into the sense amplifier. It would also be possible to tie the gate of an EFET in a sense amplifier to a separate reference voltage VR generated on the chip from VDD. However, VR will still be subject to VDD noise, the generator will dissipate power, and the necessarily limited current capability will allow noise coupling to VR via stray capacitance with switching lines in the memory array.

The present invention alleviates these and other difficulties by providing a memory sense amplifier which has a high gain, low noise and a high speed. Moreover, it is physically small and thus its size does not stand in the way of the increased storage densities which its function helps to achieve. No separate voltage generator VR is required, so dissipation and complexity are reduced. Generally speaking, a sense amplifier according to the invention includes a grounded-gate depletion-mode FET (DFET) coupled between a memory-array bit line and a sense node. Another FET, preferably in enhancement-mode FET (EFET), is coupled between the sense node and a supply voltage; its gate is controlled by a clock-phase signal occurring during every storage cycle. The DFET gate is thus at solid ground, the lowest-noise line in the entire array. The depletion-mode implant for the DFET normally will not increase manufacturing costs, since it is already used for other purposes in many memory circuits.

Although a DFET can also be operated in a so-called "enhancement mode", the term depletion FET or DFET as used herein refers to a FET whose channel region includes an extra doping such that it has a negative threshold voltage for an N-channel device; or a positive threshold voltage for a P-channel device. In contrast, an EFET has a positive threshold voltage for an N-channel device, or a negative threshold voltage for a P-channel device. Also, to avoid confusion, the enhancement/depletion characteristic of an FET will be referred to as the "type" of the FET, while the N-channel/P-channel characteristic will be referred to as the "polarity" of the FET.

DESCRIPTION OF A PREFERRED EMBODIMENT

Figure 1:
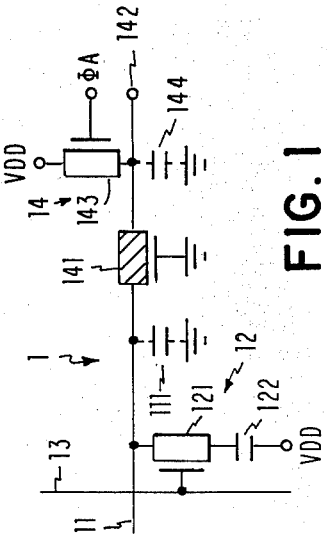
FIG. 1 shows a simplified sense-amplifier circuit illustrating the operation of the invention.

FIG. 1 shows a simplified circuit for explaining the operation of the present sense amplifier. Memory array 1 has a bit line 11 coupled to a set of storage cells 12, only one of which is shown. Each cell 12 includes a conventional field-effect transistor (FET) 121 having a drain coupled to bit line 11, a gate coupled to a word line 13 and a source coupled to a storage capacitor 122. The other plate of capacitor 122 is tied to a constant positive supply potential VDD. FET 121 is an N-channel enhancement-mode FET (EFET); that is, it is switched on by a positive signal on word line 13. Sense amplifier 14 includes an N-channel depletion-mode FET (DFET) 141 having a source connected to bit line 11, a drain defining a sense node 142 and a gate coupled directly to a ground potential. An N-channel DFET conducts with no gate-to-source bias, and is turned off with a negative voltage difference from gate to source. The drawing consistantly shows DFETs with cross-hatched symbols, while EFET symbols are open. Another FET, 143, has a source coupled to sense node 142 and a drain connected to supply voltage VDD. Its gate receives a clock Phase A from a conventional clock-signal generator, not shown. FET 143 is preferably an N-channel EFET, but could also be an N-channel DFET. That is, FETs 141 and 143 must be of the same polarity, but can be of the same or different type.

During an initial "restore" portion of a storage cycle of memory array 1, A goes high, turning on EFET 143, precharging the high distributed capacitance 111 of bit line 11 to the threshold voltage VTD of DFET 141. (That is, as soon as bit line 11 reaches the threshold of DFET 141, Vgs=−VTD and DFET 141 turns off, precluding further charging.) The smaller distributed capacitance 144 associated with sense node 142 is charged to the difference between the positive A voltage and the threshold voltage of EFET 143, VA−VTE. This voltage must be higher than VTD, and is preferably equal to VDD. This can be achieved by bootstrapping VA above VDD by conventional means, so that VA−VTE=VDD. If FET 143 is a DFET, then VA is charged to VDD. Then, at a fixed time in the memory cycle, A falls and turns off EFET 143. Assume that a conventional address decoder (not shown) turns on storage-cell FET 121 via word line 13. If a binary "one" is stored in cell capacitor 122, no change occurs, and sense node 142 remains high. If cell 12 contains a "zero", capacitor 122 attempts to pull bit line 11 toward ground. Since capacitor 122 is much smaller than distributed bit-line capacitance 111, the resulting voltage drop on line 11 is quite small, typically only about 2% of VDD. But, because line 11 falls slightly lower than VTD, DFET 141 immediately turns on. Then, since distributed sense-node capacitance 144 is much smaller than capacitance 111, the voltage at sense node 142 falls immediately toward the voltage on bit line 11. In this way, a small voltage swing on line 11 is amplified to a much larger swing at node 142. Amplification factors of ten or more can be achieved, so that the available signal swing can be increased to more than 20% of VDD. It is crucial that FET 141 operate out of its linear region (i.e., at or close to cutoff) to provide amplification; otherwise, it would merely act as a resistor.

When the terms "source" and "drain" are used herein, it must be remembered that these two elements of an integrated-circuit FET are interchangeable with each other.

Figure 2:
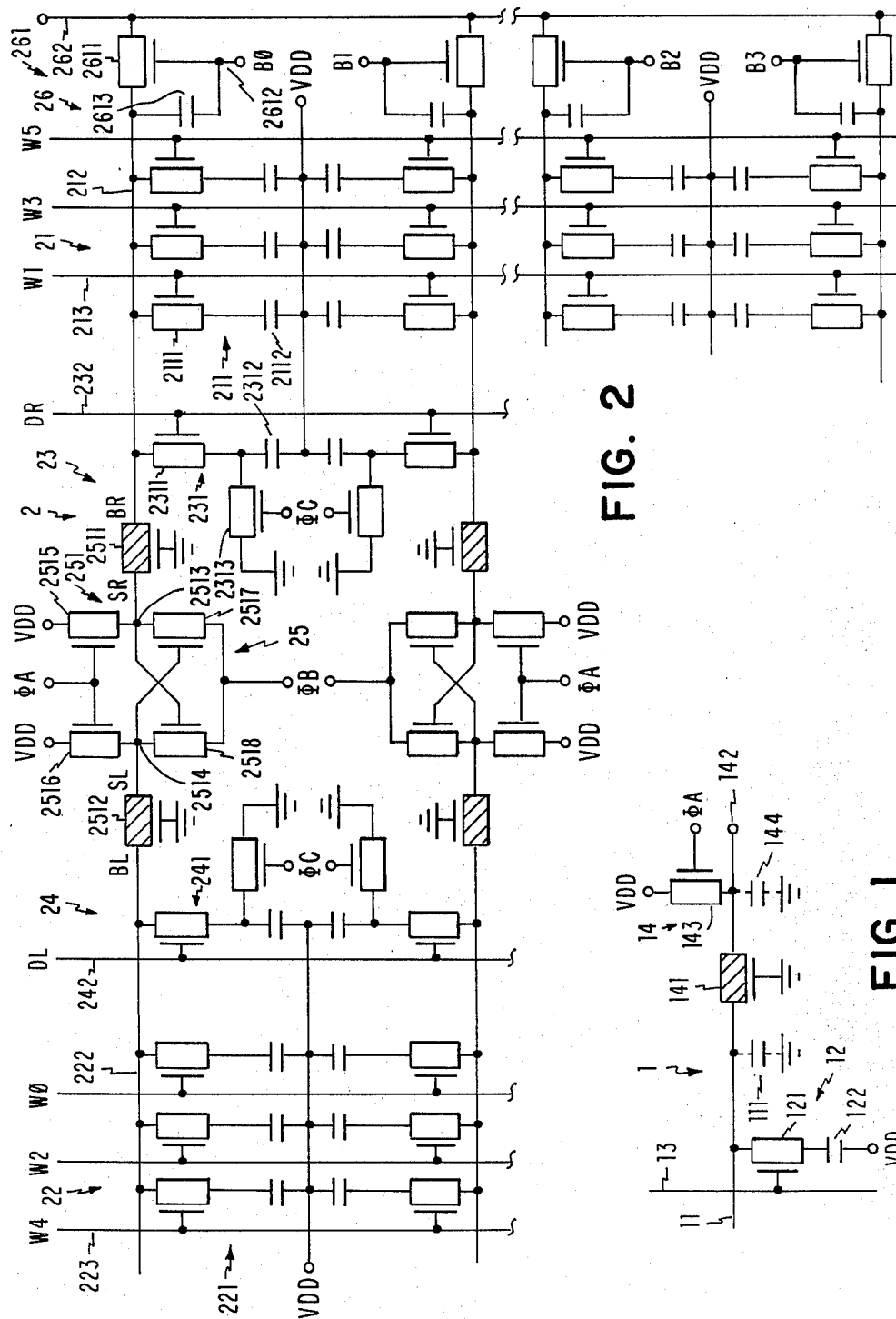
FIG. 2 is a portion of a dynamic read/write memory array incorporating sense amplifiers according to the invention.

FIG. 2 illustrates a memory array 2 which incorporates the present invention. Two similar array halves 21, 22 each have a set of storage cells such as 211, 221 respectively. Taking cell 211 as typical, an N-channel enhancement FET 2111 is coupled between a bit line 212 and a storage capacitor 2112, whose other side is tied to a positive supply voltage VDD. The gate of FET 2111 connects to one of several conventional word lines 213. Conventional dummy cells 23, 24 provide differential reference cells for signal/noise ratio enhancement. Taking cell 231 as typical, FET 2311 and capacitor 2312 function like a storage cell, except that FET 2313 places a ground potential in the cell during clock phase C to provide a reference level halfway between a "zero" and a "one". The capacitance of capacitor 2312 is about half that of 2112.

Sense amplifiers 25 serve each pair of bit lines. Typical amplifier 251 connects to bit lines 212, 222 via DFETs 2511, 2512, which correspond to DFET 141 of FIG. 1. Sense nodes 2513, 2514 connect these DFETs to FETs 2515, 2516, which correspond to FET 143 of FIG. 1. The drains of these FETs are tied to supply voltage VDD, while their gates both receive clock phase A. In addition, two latch FETs 2517, 2518 have their drains connected to sense nodes 2513, 2514 and their gates cross-coupled thereto. Their drains are tied to another clock phase, B.

When the latch FETs are clocked on by B, one bit line of each pair such as 212, 222 will be held low, and the other will be held high. Output circuit 26 contains a separate switch for each pair of bit lines. Switch 261, for example, passes the state of bit line 212 (which is opposite to the state of line 222) to common data line 262 when FET 2611 is switched on by a signal on line 2612 from a conventional address decoder (not shown). A small capacitor 2613 is sometimes placed as shown in switch 261 to accommodate memory arrays having single-ended read/write circuits.

Figure 3:
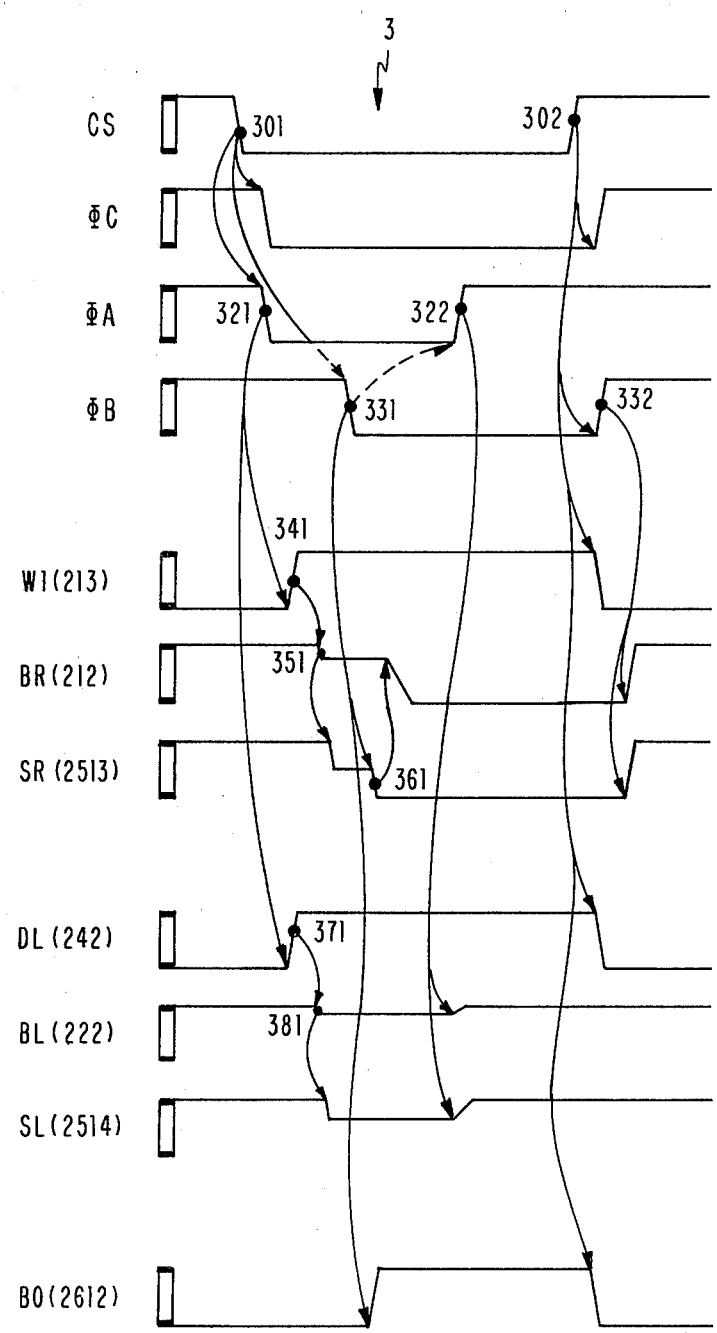
FIG. 3 is a timing diagram for a representative storage cycle of the memory array shown in FIG. 2.

FIG. 3 is a timing diagram showing one complete read cycle 3 for the case where a "zero" is stored in the addressed cell of the array shown in FIG. 2. The lowest potential of each signal in FIG. 3 is ground; all other potentials are positive with respect to ground.

First, a conventional external "Chip Select" signal CS identifies array 2 as having been addressed by some external device, not shown. CS initiates the three clock phases A, B, C at 301; B lags the others due to intentional circuit delays. A and the specific word address presented to the circuit cause a particular one W1 of the word lines 213 to go high after event 321. Simultaneously, one of the dummy-cell address lines 232, 242 goes high; in this example, DL line 242 comes up, because W1 is located in the opposite array half 21. Also, the fall of C after 301 causes the dummy-cell FETs such as 2313 to turn off.

Event 341 on word line W1 causes signal BR on bit line 212 to decrease by a small increment $\Delta V$, shown exaggerated at 351, due to the stored charge on capacitor 2112. The drop in BR is amplified by DFET 2511 to produce a much greater drop in sense signal SR at sense node 2513; typically, the drop at SR would be about $10*\Delta V$. Meanwhile, the stored charge in dummy cell 241 produces a smaller drop, about $0.5*\Delta V$, in BL at 381, which is amplified to about $5*\Delta V$ in sense signal SL at node 2514. Therefore, the differential signal SR-SL presented to sense nodes 2513, 2514, is about ten times larger than the difference between the signals BR-BL on the corresponding bit lines 212, 222.

When B drops at 331, SR is pulled down and latched by cross-coupled FETs 2517, 2518. This event also turns on the proper decoded signal BO on line 2612. Simultaneously, grounded-gate DFET 2511 transfers the drop in SR at 361 back to bit-line signal BR. Thus, the maximum signal swing is transferred to common data line 262, and is also available for refreshing the stored charge on capacitor 2112, since FET 2111 is still held on by W1.

After a circuit delay, the B drop at 331 pulls A back up. This rise at 322 pulls both BL and SL up to their original high levels. To conclude the cycle, external signal CS returns high at 302. This event terminates B, C, W1, DL and BO. The resulting rise in B at 332 allows BR and SR to rise to their initial high level.

In the above embodiment all FETs, both EFETs and DFETs, are N-channel FETs, and therefore VDD is positive with respect to ground potential. These circuits would work in exactly the same way if all FETs were P-channel types, if VDD were made negative. That is, the VDD polarity must be compatible with the FET channel polarity: positive for N-channel, negative for P-channel.

Furthermore, power consumption in the circuit of FIG. 2 can be reduced by holding the A signal low for a longer time than that shown in FIG. 3. This may be accomplished, for example, by returning A to a high level (point 322) in response to transition 302 of CS, rather than after a fixed delay from the beginning 331 of B. Power reduction occurs because sense amplifiers 25 dissipate DC power when A is returned high while B is low.

Having described preferred embodiments thereof, I claim as my invention:

1. In a memory array having a bit line connected to a set of storage cells, and having a source for producing at least one clock phase during a portion of a storage cycle of said memory array, a sense amplifier comprising:
    a depletion FET of a predetermined channel polarity and having a source coupled to said bit line, a drain coupled to a sense node, and a gate connected directly to a ground potential; and
    a further FET of the same predetermined channel polarity and having a source coupled to said sense node, a drain coupled to a compatible supply potential, and a gate connected to receive said one clock phase so as to switch said further FET both on and off during said storage cycle.

2. The memory array of claim 1, wherein said second transistor is an enhancement-mode FET.

3. The memory array of claim 1, wherein said predetermined channel polarity is N-channel.

4. In a memory array having first and second bit lines connected to first and second sets of storage cells, and having a source for producing multiple clock phases during a storage cycle of said memory array, a sense amplifier comprising:
 first and second depletion FETs each of the same predetermined channel polarity and having a source connected to one of said bit lines, a drain connected to one of first and second sense nodes, and a gate connected directly to a ground potential;
 third and fourth FETs each of said same predetermined channel polarity and having a source connected to one of said sense nodes, a drain connected to a compatible supply potential, and a gate connected to a first of said clock phases; and
 fifth and sixth FETs each having a source connected to a second of said clock phases, a drain connected to one of said sense nodes, and a gate connected to an opposite one of said sense nodes so as to form a latch circuit.

5. The memory array of claim 4, wherein said predetermined channel polarity is N-channel.

6. The memory array of claim 5, wherein said third and fourth FETs are enhancement FETs.

7. The memory array of claim 5, wherein said fifth and sixth FETs are enhancement FETs.

* * * * *